United States Patent
Zhu et al.

(10) Patent No.: US 11,323,135 B2
(45) Date of Patent: May 3, 2022

(54) POLAR CODE CODING, POLAR CODE DECODING METHOD, APPARATUS AND DEVICE

(71) Applicant: CHINA ACADEMY OF TELECOMMUNICATIONS TECHNOLOGY, Beijing (CN)

(72) Inventors: Yun Zhu, Beijing (CN); Yan Yang, Beijing (CN)

(73) Assignee: DATANG MOBILE COMMUNICATIONS EQUIPMENT CO., LTD., Beijing (CN)

(*) Notice: Subject to any disclaimer, the term of this patent is extended or adjusted under 35 U.S.C. 154(b) by 20 days.

(21) Appl. No.: 16/770,557

(22) PCT Filed: Sep. 5, 2018

(86) PCT No.: PCT/CN2018/104120
§ 371 (c)(1),
(2) Date: Jun. 5, 2020

(87) PCT Pub. No.: WO2019/109689
PCT Pub. Date: Jun. 13, 2019

(65) Prior Publication Data
US 2021/0167801 A1    Jun. 3, 2021

(30) Foreign Application Priority Data
Dec. 8, 2017 (CN) .......................... 201711292496.4

(51) Int. Cl.
*H03M 13/00* (2006.01)
*H03M 13/27* (2006.01)
(Continued)

(52) U.S. Cl.
CPC ....... *H03M 13/2792* (2013.01); *H03M 13/09* (2013.01); *H03M 13/13* (2013.01)

(58) Field of Classification Search
CPC .. H03M 13/09; H03M 13/13; H03M 13/2792; H03M 13/2906; H04L 1/00; H04L 1/0057; H04L 1/0061; H04L 1/0071
See application file for complete search history.

(56) References Cited

U.S. PATENT DOCUMENTS

| 2009/0077456 A1 | 3/2009 | Pi et al. |
| 2015/0249473 A1 | 9/2015 | Li et al. |

(Continued)

FOREIGN PATENT DOCUMENTS

| CN | 101803265 A | 8/2010 |
| CN | 103825669 A | 5/2014 |

(Continued)

OTHER PUBLICATIONS

"Design of CRC-assisted Polar Code", R1-1701630, 3GPP TSG-RAN WGI #88, Athens, Greece, Feb. 13-17, 2017 (Year: 2017).*

(Continued)

*Primary Examiner* — Albert Decady
*Assistant Examiner* — Enamul M Kabir
(74) *Attorney, Agent, or Firm* — Ladas & Parry, LLP

(57) ABSTRACT

The present disclosure provides a polar code coding method, a polar code decoding method, apparatus and device. The polar code coding method includes: obtaining a plurality of CRC check bits; determining interleaved padding positions in a to-be-coded sequence; filling a first predetermined number of CRC check bits of the plurality of CRC check bits into the interleaved padding positions in the to-be-coded sequence in an interleaving manner; and performing polar coding on the to-be-coded sequence that is filled with the predetermined number of CRC check bits in interleaving manner, and transmitting a coded sequence to a receiving end. The first predetermined number is less than or equal to a total number of the plurality of CRC check bits.

16 Claims, 6 Drawing Sheets

(51) Int. Cl.
*H03M 13/09* (2006.01)
*H03M 13/13* (2006.01)

(56) References Cited

U.S. PATENT DOCUMENTS

| | | | | |
|---|---|---|---|---|
| 2016/0013810 A1* | 1/2016 | Gross | .................... | H03M 13/13 |
| | | | | 714/776 |
| 2016/0079999 A1* | 3/2016 | Shen | ..................... | H04L 1/0071 |
| | | | | 714/758 |
| 2016/0182092 A1 | 6/2016 | Mansour et al. | | |
| 2017/0214416 A1* | 7/2017 | Ge | ......................... | H03M 13/13 |
| 2017/0288703 A1* | 10/2017 | Shen | ..................... | H04L 1/0071 |
| 2020/0201712 A1* | 6/2020 | Kamiya | .............. | G06F 11/1004 |

FOREIGN PATENT DOCUMENTS

| | | | |
|---|---|---|---|
| CN | 104219019 | A | 12/2014 |
| CN | 105227189 | A | 1/2016 |
| CN | 106788456 | A | 5/2017 |
| CN | 106849960 | A | 6/2017 |
| CN | 106888026 | A | 6/2017 |
| CN | 107231158 | A | 10/2017 |
| CN | 107359967 | A | 11/2017 |
| WO | 2014116041 | A1 | 7/2014 |
| WO | 2017133580 | A1 | 8/2017 |
| WO | 2017188873 | A1 | 11/2017 |
| WO | 2017209836 | A1 | 12/2017 |

OTHER PUBLICATIONS

Hashemi, Sayyed Ali et al., "A Fast Polar Code List Decoder Architecture Based on Sphere Decoding", IEEE Transactions on Circuits and Systems I: Regular Papers, IEEE US, vol. 63, No. 12, Dec. 2016. (Year: 2016).*
Extended European Search Report from EP app. No. 18886411.0, dated Jan. 12, 2021.
Hashemi, Sayyed Ali et al., "A Fast Polar Code List Decoder Architecture Based on Sphere Decoding", IEEE Transactions on Circuits and Systems I: Regular Papers, IEEE US, vol. 63, No. 12, Dec. 2016.
"Design of CRC-assisted Polar Code", R1-1701630, 3GPP TSG-RAN WG1 #88, Athens, Greece, Feb. 13-17, 2017.
"CRC related design of Polar codes", R1-1705756, 3GPP TSG RAN WG1 Meeting #88bis, Spokane, USA, Apr. 3-7, 2017.
First office action and search report from CN app. No. 201711292496.4, dated Jun. 16, 2020, with English translation from Global Dossier.
International Search Report from PCT/CN2018/104120, dated Nov. 1, 2018, with English translation from WIPO.
Written Opinion of the International Searching Authority from PCT/CN2018/104120, dated Nov. 1, 2018, with English translation from WIPO.
International Preliminary Report on Patentability from PCT/CN2018/104120, dated Jun. 9, 2020, with English translation from WIPO.
Sarkis et al., "Fast Polar Decoders: Algorithm and Implementation", IEEE Journal on Selected Areas in Communications, vol. 32, No. 5, May 2014, pp. 946-957.
"Design details of distributed CRC", R1-1708833, 3GPP TSG RAN WG1 Meeting #89, Hangzhou, P.R. China, May 15-19, 2017.

* cited by examiner

POLAR CODE CODING, POLAR CODE DECODING METHOD, APPARATUS AND DEVICE

CROSS-REFERENCE TO RELATED APPLICATIONS

This application is the U.S. national phase of PCT Application PCT/CN2018/104120 filed on Sep. 5, 2018, which claims the benefit and priority of Chinese Application No. 201711292496.4, filed on Dec. 8, 2017, the disclosures of which are incorporated in their entireties by reference herein.

TECHNICAL FIELD

The present disclosure relates to the field of communication technologies, and in particular, to a polar code coding method, a polar code decoding method, apparatus and device.

BACKGROUND

Polar code is currently the only channel coding that may reach the Shannon limit in theory, and has low coding and decoding complexity. Once proposed, it has attracted wide attention in academia and industry. The 3rd Generation Partnership Project (3GPP), which is the international standardization organization for mobile communication, has determined the polar code as the control channel coding scheme for the 5G Enhance Mobile Broadband (eMBB) scenario.

FIG. 1 shows a polar code coding scheme in the related art. An information bit sequence of length K is first generated by adding Cyclic Redundancy Check (CRC) check bit to payload of downlink (uplink) channel. Then, according to the order from front to back, information bits are filled into a coding sequence with a mother code length of N. Extra bits in the mother code are filled with 0, which are referred as frozen bits; and K/N is referred as a code rate.

According to the 3GPP agreement, the CRC check bit length of downlink control channel is 24; the CRC 16 of length 11 may be increased for uplink control channel according to transmission block length; and the coded mother code length N is 256 or 512.

FIG. 2 shows a polar code decoding scheme (with the mother code length N being 8) described by a complete binary tree in the related art. The top layer of the binary tree is a sequence of soft bits received by a decoder, and soft bit values are updated by successive halving (referred to as a operation) from the top to the bottom, until a node 7 in a lowest layer (layer 0). After path selection is performed on the node 7, a soft bit value of a node 8 is updated according to a hard decision result of the selected path, path split is performed on the node 8, and the hard decision result is fed back to an upper layer (referred to as β operation). And so on, until the node 7 to a node 14 (referred to as leaf nodes) are all traversed.

In the decoding process, since updating of the soft bit value of the latter node depends on the hard decision result of the path selection of the former node, the parallel algorithm cannot be used, which results in that the decoding of polar codes has a large decoding delay and a large decoding complexity.

SUMMARY

In view of this, the present disclosure provides a polar code coding method, a polar code decoding method, apparatus, device, and a computer readable storage medium, which can reduce the delay and complexity in decoding polar codes.

In order to solve the above technical problem, in a first aspect, one embodiment of the present disclosure provides a polar code coding method, including: obtaining a plurality of CRC check bits; determining interleaved padding positions in a to-be-coded sequence; filling a first predetermined number of CRC check bits of the plurality of CRC check bits into the interleaved padding positions in the to-be-coded sequence in an interleaving manner; and performing polar coding on the to-be-coded sequence that is filled with the predetermined number of CRC check bits in interleaving manner, and transmitting a coded sequence to a receiving end. The first predetermined number is less than or equal to a total number of the plurality of CRC check bits.

The filling a first predetermined number of CRC check bits of the plurality of CRC check bits into the interleaved padding positions in the to-be-coded sequence in an interleaving manner, includes:

coalescing a complete binary tree corresponding to a polar codeword into a minimum incomplete binary tree, and determining to-be-processed nodes in the minimum incomplete binary tree, wherein the to-be-processed nodes include at least one type of nodes among Rate0 node, Rate1 node, REP node or SPC node;

interleaving the CRC check bit in the first predetermined number of CRC check bits to a position of a last bit in a bit sequence of any one of the to-be-processed nodes;

according to a padding position where an interleaved CRC check bit is located, determining a CRC check bit value of the interleaved CRC check bit at the padding position and filling the value to the padding position.

An interleaved padding position L meets the following conditions: $L=2^{N_1}+2^{N_2}+\ldots 2^{N_n}$, wherein $N_1 \ldots N_n$ are arbitrary integers;

a first CRC check bit that is filled into a first padding position in an interleaving manner, is generated by all bits preceding the first padding position in the to-be-coded sequence;

a second CRC check bit that is filled into an X-th padding position except for the first padding position, is generated by all bits which are between a CRC check bit at a (X−1)-th padding position and the X-th padding position; or, the second CRC check bit that is filled into the X-th padding position except for the first padding position, is generated by all bits which are between the CRC check bit at the (X−1)-th padding position and the X-th padding position as well as a third predetermined number of bits preceding the (X−1)-th padding position; wherein the third predetermined number is less than or equal to a total number of bits preceding the (X−1)-th padding position; wherein X is an integer greater than two.

The coalescing a complete binary tree corresponding to a polar codeword into a minimum incomplete binary tree, and determining to-be-processed nodes in the minimum incomplete binary tree, wherein the to-be-processed nodes include at least one type of nodes among Rate0 node, Rate1 node, REP node or SPC node, includes:

in a first layer of the complete binary tree, if both two child nodes of a first target node are frozen bits, determining the first target node as a Rate0 node; if both two child nodes of the first target node are information bits, determining the first target node as a Rate1 node; if a left child node of the first target node is a frozen bit and a right child node of the first target node is an information bit, determining the first target node as an REP node; if the left child node of the first target node is an information bit and a right child node of the first target node is a frozen bit, determining the first target node as a node that is not of the four types;

in a second layer of the complete binary tree, if both two child nodes of a second target node are Rate0 nodes, determining the second target node as a Rate0 node; if both two child nodes of the second target node are Rate1 nodes, determining the second target node as a Rate1 node; if a left child node of the second target node is a Rate0 node and a right child node of the second target node is an REP node, determining the second target node as an REP node; if the left child node of the second target node is an REP node and the right child node of the first target node is a Rate1 node, determining the second target node as an SPC node; otherwise, determining the second target node as a node that is not of the four types;

for each layer of a third layer to a topmost layer of the complete binary tree from bottom to top, if both two child nodes of a third target node are Rate0 nodes, determining the third target node as a Rate0 node; if both two child nodes of the third target node are Rate1 nodes, determining the third target node as a Rate1 node; if a left child node of the third target node is a Rate0 node and a right child node of the third target node is an REP node, determining the third target node as an REP node; if the left child node of the third target node is an SPC node and the right child node of the third target node is a Rate1 node, determining the third target node as an SPC node; otherwise, determining the third target node as a node that is not of the four types.

The method further includes: transmitting information of the interleaved padding positions to the receiving end; or, pre-arranging the information of the interleaved padding positions with the receiving end.

In a second aspect, one embodiment of the present disclosure provides a polar code decoding method, including:

receiving a coded sequence transmitted by a transmitting end;

obtaining information of an interleaved padding position of a CRC check bit in the coded sequence; and decoding the coded sequence according to the information of the interleaved padding position.

The decoding the coded sequence according to the information of the interleaved padding position, includes:

according to the coded sequence, coalescing a decoding binary tree corresponding to the coded sequence into a minimum incomplete binary tree, and determining to-be-processed nodes in the minimum incomplete binary tree, wherein the to-be-processed nodes include at least one type of nodes among Rate0 node, Rate1 node, REP node or SPC node; and decoding the to-be-processed nodes according to the information of the interleaved padding position.

The decoding the to-be-processed nodes according to the information of the interleaved padding position, includes:

performing updating soft bit value calculation and feedback calculation of the hard decision result for the to-be-processed node;

when determining that the to-be-processed node is filled with a CRC check bit in interleaving manner according to the information of the interleaved padding position, performing CRC check on a first bit in a hard decision result of the to-be-processed node;

reserving a decoding path corresponding to the to-be-processed node when the CRC check is successful, and deleting a decoding path corresponding to the to-be-processed node when the CRC check is unsuccessful; and ending decoding when decoding paths of all the to-be-processed nodes are deleted.

The obtaining information of an interleaved padding position of a CRC check bit in the coded sequence, includes:

receiving the information of the interleaved padding position of the CRC check bit in the coded sequence transmitted by the transmitting end; or, obtaining the information of the interleaved padding position of the CRC check bit in the coded sequence according to a pre-agreement with the transmitting end.

In a third aspect, one embodiment of the present disclosure provides a polar code coding apparatus including:

an obtaining module configured to obtain a plurality of CRC check bits;

a determining module configured to determine interleaved padding positions in a to-be-coded sequence;

an interleaving-filling module configured to fill a first predetermined number of CRC check bits of the plurality of CRC check bits into the interleaved padding positions in the to-be-coded sequence in an interleaving manner;

a transmission module configured to perform polar coding on the to-be-coded sequence that is filled with the predetermined number of CRC check bits in interleaving manner and transmit a coded sequence to a receiving end;

wherein the first predetermined number is less than or equal to a total number of the plurality of CRC check bits.

The interleaving-filling module includes:

a first processing sub-module configured to coalesce a complete binary tree corresponding to a polar codeword into a minimum incomplete binary tree, and determine to-be-processed nodes in the minimum incomplete binary tree, wherein the to-be-processed nodes include at least one type of nodes among Rate0 node, Rate1 node, REP node or SPC node;

a determining sub-module configured to interleave the CRC check bits in the first predetermined number of CRC check bits to a position of a last bit in a bit sequence of any one of the to-be-processed nodes;

an interleaving-filling sub-module configured to, according to a padding position where an interleaved CRC check bit is located, determine a CRC check bit value of the interleaved CRC check bit at the padding position and fill the value to the padding position.

An interleaved padding position L meets the following conditions: $L=2^{N_1+2N_2}+ \ldots 2^{N_{ts}\,n}$, wherein $N_1 \ldots N_n$ are arbitrary integers;

a first CRC check bit that is filled into a first padding position in an interleaving manner, is generated by all bits preceding the first padding position in the to-be-coded sequence;

a second CRC check bit that is filled into an X-th padding position except for the first padding position, is generated by all bits which are between a CRC check bit at a (X−1)-th padding position and the X-th padding position; or, the second CRC check bit that is filled into the X-th padding position except for the first padding position, is generated by all bits which are between the CRC check bit at the (X−1)-th padding position and the X-th padding position as well as a third predetermined number of bits preceding the (X−1)-th padding position; wherein the third predetermined number is less than or equal to a total number of bits preceding the (X−1)-th padding position; wherein X is an integer greater than two.

The first processing sub-module is configured to, in a first layer of the complete binary tree, if both two child nodes of a first target node are frozen bits, determine the first target node as a Rate0 node; if both two child nodes of the first target node are information bits, determine the first target node as a Rate1 node; if a left child node of the first target node is a frozen bit and a right child node of the first target node is an information bit, determine the first target node as an REP node; if the left child node of the first target node is an information bit and a right child node of the first target node is a frozen bit, determine the first target node as a node that is not of the four types;

in a second layer of the complete binary tree, if both two child nodes of a second target node are Rate0 nodes, determine the second target node as a Rate0 node; if both two child nodes of the second target node are Rate1 nodes, determine the second target node as a Rate1 node; if a left child node of the second target node is a Rate0 node and a right child node of the second target node is an REP node, determine the second target node as an REP node; if the left child node of the second target node is an REP node and the right child node of the first target node is a Rate1 node, determine the second target node as an SPC node; otherwise, determine the second target node as a node that is not of the four types;

for each layer of a third layer to a topmost layer of the complete binary tree from bottom to top, if both two child nodes of a third target node are Rate0 nodes, determine the third target node as a Rate0 node; if both two child nodes of the third target node are Rate1 nodes, determine the third target node as a Rate1 node; if a left child node of the third target node is a Rate0 node and a right child node of the third target node is an REP node, determine the third target node as an REP node; if the left child node of the third target node is an SPC node and the right child node of the third target node is a Rate1 node, determine the third target node as an SPC node; otherwise, determine the third target node as a node that is not of the four types.

In a fourth aspect, one embodiment of the present disclosure provides a polar code decoding apparatus including:

a receiving module configured to receive a coded sequence transmitted by a transmitting end;

an obtaining module configured to obtain information of an interleaved padding position of a CRC check bit in the coded sequence; and a decoding module configured to decode the coded sequence according to the information of the interleaved padding position.

The decoding module includes:

a second processing sub-module configured to, according to the coded sequence, coalesce a decoding binary tree corresponding to the coded sequence into a minimum incomplete binary tree, and determine to-be-processed nodes in the minimum incomplete binary tree, wherein the to-be-processed nodes include at least one type of nodes among Rate0 node, Rate1 node, REP node or SPC node; and a decoding sub-module configured to decode the to-be-processed nodes according to the information of the interleaved padding position.

The decoding sub-module includes:

a calculating unit configured to perform updating soft bit value calculation and feedback calculation of hard decision result for the to-be-processed node;

a check unit configured to, when determining that the to-be-processed node is filled with a CRC check bit in interleaving manner according to the information of the interleaved padding position, perform CRC check on a first bit in the hard decision result of the to-be-processed node;

a first processing unit configured to reserve a decoding path corresponding to the to-be-processed node when the CRC check is successful, and delete a decoding path corresponding to the to-be-processed node when the CRC check is unsuccessful; and a second processing unit configured to end decoding when decoding paths of all the to-be-processed nodes are deleted.

In a fifth aspect, one embodiment of the present disclosure provides a polar code coding device including: a transceiver, a memory, a processor and a computer program stored on the memory and executable on the processor;

wherein the processor is configured to read the program in the memory to perform the following process: obtaining a plurality of CRC check bits; determining interleaved padding positions in a to-be-coded sequence; filling a first predetermined number of CRC check bits of the plurality of CRC check bits into the interleaved padding positions in the to-be-coded sequence in an interleaving manner; performing polar coding on the to-be-coded sequence that is filled with the predetermined number of CRC check bits in interleaving manner;

the transceiver is configured to transmit a coded sequence to a receiving end;

the first predetermined number is less than or equal to a total number of the plurality of CRC check bits.

The processor is configured to read the program in the memory to perform the following process:

coalescing a complete binary tree corresponding to a polar codeword into a minimum incomplete binary tree, and determining to-be-processed nodes in the minimum incomplete binary tree, wherein the to-be-processed nodes include at least one type of nodes among Rate0 node, Rate1 node, REP node or SPC node;

interleaving the CRC check bits in the first predetermined number of CRC check bits to a position of a last bit in a bit sequence of any one of the to-be-processed nodes;

according to a padding position where an interleaved CRC check bit is located, determining a CRC check bit value of the interleaved CRC check bit at the padding position and filling the value to the padding position.

An interleaved padding position L meets the following conditions: $L=2^{N_1}+2^{N_2}+\ldots 2^{N_n}$, wherein $N_1 \ldots N_n$ are arbitrary integers;

a first CRC check bit that is filled into a first padding position in an interleaving manner, is generated by all bits preceding the first padding position in the to-be-coded sequence;

a second CRC check bit that is filled into an X-th padding position except for the first padding position, is generated by all bits which are between a CRC check bit at a (X−1)-th padding position and the X-th padding position; or, the second CRC check bit that is filled into the X-th padding position except for the first padding position, is generated by all bits which are between the CRC check bit at the (X−1)-th padding position and the X-th padding position as well as a third predetermined number of bits preceding the (X−1)-th padding position; wherein the third predetermined number is less than or equal to a total number of bits preceding the (X−1)-th padding position; wherein X is an integer greater than two.

The processor is configured to read the program in the memory to perform the following process:

in a first layer of the complete binary tree, if both two child nodes of a first target node are frozen bits, determining the first target node as a Rate0 node; if both two child nodes of the first target node are information bits, determining the first target node as a Rate1 node; if a left child node of the first target node is a frozen bit and a right child node of the first target node is an information bit, determining the first target node as an REP node; if the left child node of the first target node is an information bit and a right child node of the first target node is a frozen bit, determining the first target node as a node that is not of the four types;

in a second layer of the complete binary tree, if both two child nodes of a second target node are Rate0 nodes, determining the second target node as a Rate0 node; if both two child nodes of the second target node are Rate1 nodes, determining the second target node as a Rate1 node; if a left child node of the second target node is a Rate0 node and a right child node of the second target node is an REP node, determining the second target node as an REP node; if the left child node of the second target node is an REP node and the right child node of the first target node is a Rate1 node, determining the second target node as an SPC node; otherwise, determining the second target node as a node that is not of the four types;

for each layer of a third layer to a topmost layer of the complete binary tree from bottom to top, if both two child nodes of a third target node are Rate0 nodes, determining the third target node as a Rate0 node; if both two child nodes of the third target node are Rate1 nodes, determining the third target node as a Rate1 node; if a left child node of the third target node is a Rate0 node and a right child node of the third target node is an REP node, determining the third target node as an REP node; if the left child node of the third target node is an SPC node and the right child node of the third target node is a Rate1 node, determining the third target node as an SPC node; otherwise, determining the third target node as a node that is not of the four types.

The transceiver is further configured to transmit information of the interleaved padding position to the receiving end; or, the processor is further configured to read the program in the memory to perform the following process: pre-arranging with the receiving end the information of the interleaved padding position.

In a sixth aspect, one embodiment of the present disclosure provides a polar code decoding device including: a transceiver, a memory, a processor and a computer program stored on the memory and executable on the processor. The transceiver is configured to receive a coded sequence transmitted by a transmitting end. The processor is configured to read the program in the memory to perform the following process: obtaining information of an interleaved padding position of a CRC check bit in the coded sequence; and decoding a coded sequence according to the information of the interleaved padding position.

The processor is further configured to read the computer program to perform the following process:

according to the coded sequence, coalescing a decoding binary tree corresponding to the coded sequence into a minimum incomplete binary tree, and determining to-be-processed nodes in the minimum incomplete binary tree, wherein the to-be-processed nodes include at least one type of nodes among Rate0 node, Rate1 node, REP node or SPC node; and decoding the to-be-processed nodes according to the information of the interleaved padding position.

The processor is further configured to read the computer program to perform the following process:

performing updating soft bit value calculation and feedback calculation of hard decision result for the to-be-processed node;

when determining that the to-be-processed node is filled with a CRC check bit in interleaving manner according to the information of the interleaved padding position, performing CRC check on a first bit in the hard decision result of the to-be-processed node;

reserving a decoding path corresponding to the to-be-processed node when the CRC check is successful, and deleting a decoding path corresponding to the to-be-processed node when the CRC check is unsuccessful; and ending decoding when decoding paths of all the to-be-processed nodes are deleted.

The transceiver is further configured to receive the information of the interleaved padding position of the CRC check bit in the coded sequence transmitted by the transmitting end; or, the processor is further configured to read the program in the memory to perform the following process: receiving the information of the interleaved padding position of the CRC check bit in the coded sequence according to a pre-agreement with the transmitting end.

In a seventh aspect, one embodiment of the present disclosure provides a computer readable storage medium including a computer program stored thereon; wherein the computer program is executed by a processor to implement steps of the method according to the first aspect, or, the computer program is executed by the processor to implement steps of the method according to the second aspect.

The beneficial effects of the above technical solutions of the present disclosure are as follows:

in one embodiment of the present disclosure, in the coding process, the CRC check bits are filled into the interleaved padding position in the to-be-coded sequence in interleaving manner, and then the to-be-coded sequence is coded, so that when a decoding end performs decoding, combination of decoding process and CRC check process can be performed, thereby reducing decoding delay and reducing decoding complexity.

BRIEF DESCRIPTION OF THE DRAWINGS

In order to illustrate technical solutions according to embodiments of the present disclosure more clearly, drawings to be used in the description of the embodiments will be described briefly hereinafter. Apparently, the drawings described hereinafter are only some embodiments of the present disclosure, and other drawings may be obtained by those skilled in the art according to those drawings without creative work.

DETAILED DESCRIPTION

The technical solution of embodiments of the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Figure 3:
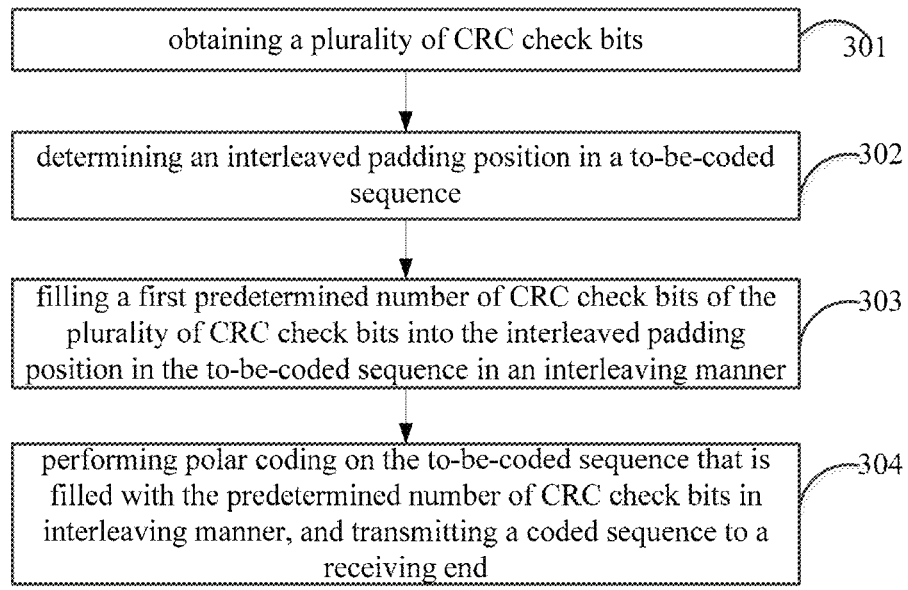
FIG. 3 is a flowchart of a polar code coding method according to an embodiment of the present disclosure.

As shown in FIG. 3, a polar code coding method according to one embodiment of the present disclosure includes the following steps.

Step 301: obtaining a plurality of CRC check bits.

For a sequence input into an encoder, CRC coding is first performed to obtain a plurality of CRC check bits.

Step 302: determining an interleaved padding position in a to-be-coded sequence.

In one embodiment of the present disclosure, the interleaved padding position meets the following conditions:

(1) an interleaved padding position L meets the following condition: $L=2^{N_1}+2^{N_2}+\ldots 2^{N_n}$, where $N_1 \ldots N_n$ are arbitrary integers;

(2) a first CRC check bit that is filled into a first padding position in an interleaving manner, is generated by all bits preceding the first padding position in the to-be-coded sequence;

(3) a second CRC check bit that is filled into an X-th padding position except for the first padding position, is generated by all bits which are between a CRC check bit at a (X−1)-th padding position and the X-th padding position; or, the second CRC check bit that is filled into the X-th padding position except for the first padding position, is generated by all bits which are between the CRC check bit at the (X−1)-th padding position and the X-th padding position as well as a third predetermined number of bits preceding the (X−1)-th padding position. The third predetermined number is less than or equal to a total number of bits preceding the (X−1)-th padding position, where X is an integer greater than two.

Step 303: filling a first predetermined number of CRC check bits of the plurality of CRC check bits into the interleaved padding position in the to-be-coded sequence in an interleaving manner.

Specifically, in this step, a complete binary tree corresponding to a polar codeword is coalesced into a minimum incomplete binary tree, and to-be-processed nodes are determined in the minimum incomplete binary tree. The to-be-processed nodes include at least one type of nodes among Rate0 node, Rate1 node, REP node or SPC node. The CRC check bits in the first predetermined number of CRC check bits are interleaved to a position of the last bit in a bit sequence of any one of the to-be-processed nodes; according to the padding position where the interleaved CRC check bit is located, a CRC check bit value of the interleaved CRC check bit at the padding position is determined and the value is filled to the padding position.

In the above process, when the complete binary tree corresponding to the polar codeword is coalesced into the minimum incomplete binary tree, the above types of nodes are determined as follows:

in a first layer of the complete binary tree, if both two child nodes of a first target node are frozen bits, then the first target node is determined as a Rate0 node; if both two child nodes of the first target node are information bits, then the first target node is determined as a Rate1 node; if a left child node of the first target node is a frozen bit and a right child node of the first target node is an information bit, then the first target node is determined as an REP node; if the left child node of the first target node is an information bit and a right child node of the first target node is a frozen bit, then the first target node is determined as a node that is not of the four types;

in a second layer of the complete binary tree, if both two child nodes of a second target node are Rate0 nodes, then the second target node is determined as a Rate0 node; if both two child nodes of the second target node are Rate1 nodes, then the second target node is determined as a Rate1 node; if a left child node of the second target node is a Rate0 node and a right child node of the second target node is an REP node, then the second target node is determined as an REP node; if the left child node of the second target node is an REP node and the right child node of the first target node is a Rate1 node, then the second target node is determined as an SPC node; otherwise, the second target node is determined as a node that is not of the four types;

for each layer of a third layer to a topmost layer of the complete binary tree from bottom to top, if both two child nodes of a third target node are Rate0 nodes, then the third target node is determined as a Rate0 node; if both two child nodes of the third target node are Rate1 nodes, then the third target node is determined as a Rate1 node; if a left child node of the third target node is a Rate0 node and a right child node of the third target node is an REP node, then the third target node is determined as an REP node; if the left child node of the third target node is an SPC node and the right child node of the third target node is a Rate1 node, then the third target node is determined as an SPC node; otherwise, the third target node is determined as a node that is not of the four types.

As described above, the first CRC check bit that is filled into the first padding position in interleaving manner, is generated by all bits preceding the first padding position in the to-be-coded sequence.

The second CRC check bit that is filled into the X-th padding position except for the first padding position, is generated by all bits which are between the CRC check bit at the (X−1)-th padding position and the X-th padding position; or, the second CRC check bit that is filled into the X-th padding position except for the first padding position, is generated by all bits which are between the CRC check bit at the (X−1)-th padding position and the X-th padding position as well as the third predetermined number of bits preceding the (X−1)-th padding position. The third predetermined number is less than or equal to the total number of bits preceding the (X−1)-th padding position.

The first CRC check bit and the second CRC check bit both refer to any one of the CRC check bits.

Step 304: performing polar coding on the to-be-coded sequence that is filled with the predetermined number of CRC check bits in interleaving manner, and transmitting a coded sequence to a receiving end.

In one embodiment of the present disclosure, in the coding process, the CRC check bits are filled into the interleaved padding position in the to-be-coded sequence in interleaving manner, and then the to-be-coded sequence is coded, so that when a decoding end performs decoding, combination of decoding process and CRC check process can be performed, thereby reducing decoding delay and reducing decoding complexity.

On the basis of the above embodiment, in order to further improve the decoding efficiency and reduce the decoding delay, the method may further include: transmitting information of the interleaved padding position to the receiving end; or, pre-arranging information of the interleaved padding position with the receiving end.

Figure 4:
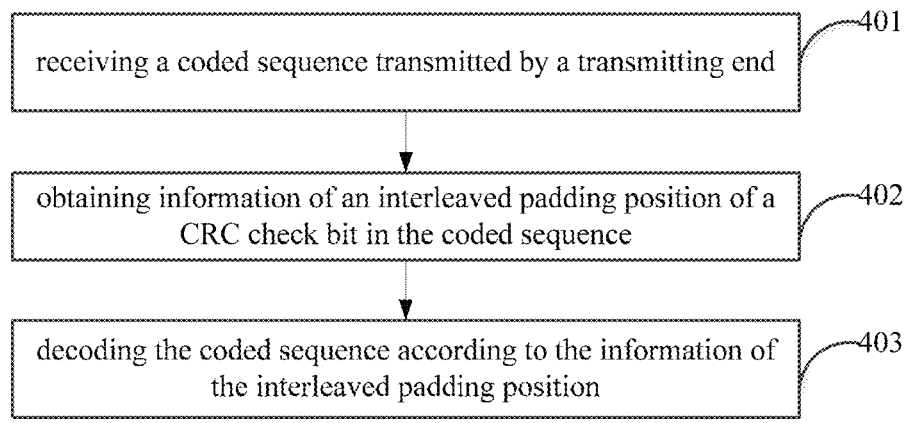
FIG. 4 is a flowchart of a polar code decoding method according to an embodiment of the present disclosure.

As shown in FIG. 4, a polar code decoding method according to one embodiment of the present disclosure includes the following steps.

Step 401: receiving a coded sequence transmitted by a transmitting end.

Step 402: obtaining information of an interleaved padding position of a CRC check bit in the coded sequence.

Specifically, in this step, the information of the interleaved padding position of the CRC check bit in the coded sequence may be obtained according to a pre-agreement with a transmitting end, or the information of the interleaved padding position of the CRC check bit in the coded sequence may be received from the transmitting end.

Step 403: decoding the coded sequence according to the information of the interleaved padding position.

In the decoding process, according to the coded sequence, a decoding binary tree corresponding to the coded sequence is coalesced into a minimum incomplete binary tree, and to-be-processed nodes are determined in the minimum incomplete binary tree. The to-be-processed nodes include at least one type of nodes among Rate0 node, Rate1 node, REP node or SPC node. The coalescing process may refer to the coalescing process in the step 303. Then, the to-be-processed node is decoded according to the information of the interleaved padding position.

Specifically, when decoding, updating soft bit value calculation and feedback calculation of the hard decision result are performed for the to-be-processed node. When it is determined that the to-be-processed node is filled with a CRC check bit in interleaving manner according to the information of the interleaved padding position, CRC check is performed on a first bit in the hard decision result of the to-be-processed node. When the CRC check is successful, a decoding path corresponding to the to-be-processed node is reserved, otherwise, the decoding path corresponding to the to-be-processed node is deleted. If it is judged that decoding paths of all to-be-processed nodes are deleted, the decoding ends.

It can be seen that combination of decoding and CRC check is performed when decoding, thereby realizing early termination of a single decoding process during a control channel blind detection process, greatly reducing total delay of control channel blind detection in 5G systems and ensuring performance of detection terminated early.

In one embodiment of the present disclosure, in the coding process, the CRC check bits are filled into the interleaved padding position in the to-be-coded sequence in interleaving manner, and then the to-be-coded sequence is coded, so that when a decoding end performs decoding, combination of decoding process and CRC check process can be performed, thereby reducing decoding delay and reducing decoding complexity.

In the related art, a method for reducing delay and complexity of polar code decoding (referred to as FSCL algorithm) is proposed. Although the polar code decoding delay may be reduced through the FSCL algorithm, the delay and decoding complexity are still large. In addition, according to the 5G standard protocol, the polar code is applied to the control channel, and the decoding process of the control channel is performed in combination with the blind detection process. The so-called blind detection means that a receiver extracts a signal from the search space to perform a decoding attempt; if the CRC check is successful, it is determined that control information is detected, otherwise it is determined that the attempt is unsuccessful. In engineering, the receiver actually makes multiple attempts in the search space (for example, in the Long Term Evolution (LTE) system, 44 blind detection attempts are required). In so many attempts, only 1-2 attempts may actually detect the control information and the rest may end in failure. Each attempt has to perform decoding first and then perform CRC check. In combination with the long delay of the single polar code decoding described above, the overall control channel reception process is long.

Figure 5:
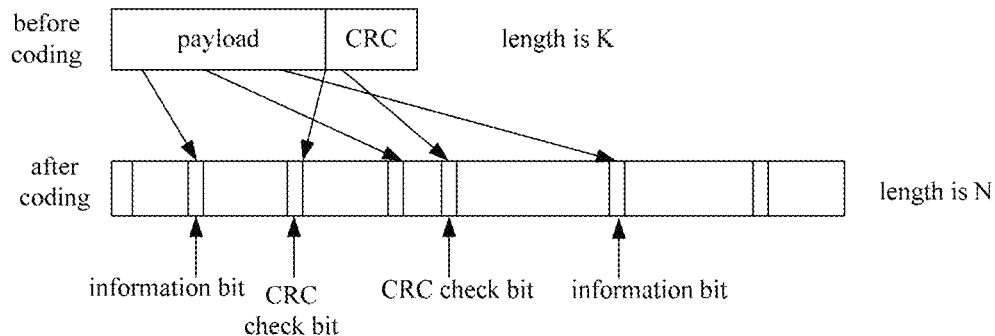
FIG. 5 is a first schematic diagram of coding polar codes according to an embodiment of the present disclosure.

In order to solve the above problem, one embodiment of the present disclosure provides a coding method, i.e., a method for interleaving polar code check bits. As shown in FIG. 5, all or some of CRC check bits are filled into specific positions in a to-be-coded sequence in interleaving manner.

Each CRC check bit filled in interleaving manner has the following characteristics in its position in the to-be-coded sequence:

(1) the position L is: $L=2^{N_1}+2^{N_2}+\ldots 2^{N_n}$, i.e., a sum of powers of 2, where $N_1 \ldots N_n$ are arbitrary integers;

(2) each CRC check bit that is filled to the position L in interleaving manner is generated by all or some of bits at positions (i.e., position 1 to position (L−1)) preceding the position L;

(3) all bits between two CRC check bits filled in interleaving manner are used to generate the latter CRC check bit.

The specific process is as follows:

Step 501: coalescing a complete binary tree corresponding to a polar codeword into a minimum incomplete binary tree.

Figure 1:
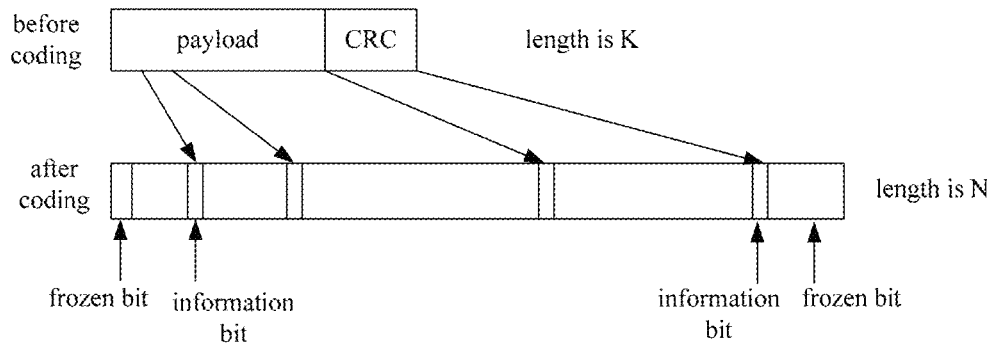
FIG. 1 is a schematic diagram of a polar code coding scheme in the related art.
Figure 2:
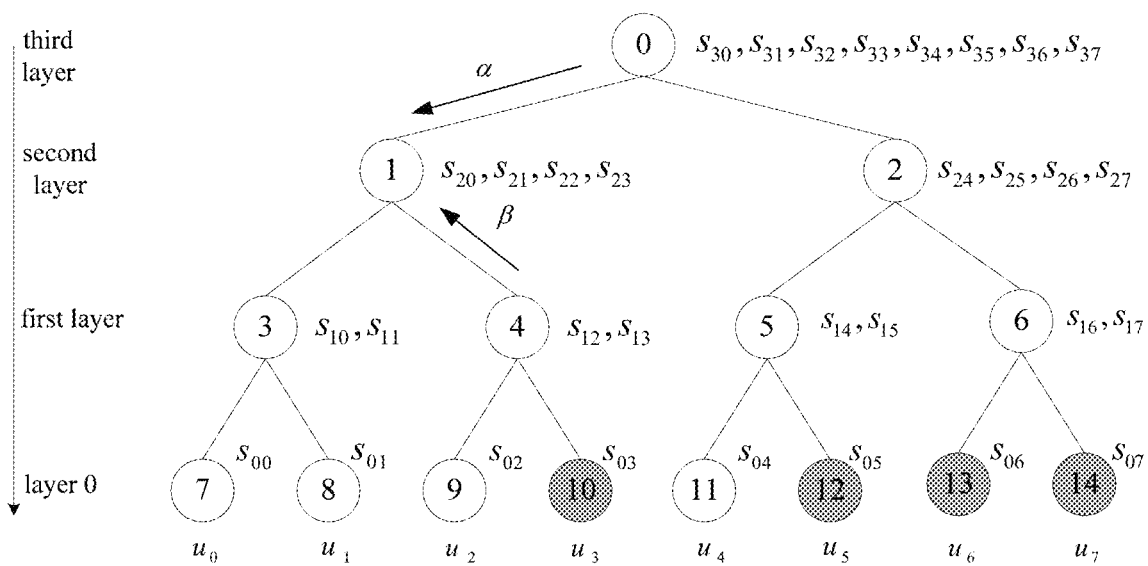
FIG. 2 is a schematic diagram of a complete binary tree of a polar code decoding scheme in the related art.

The so-called minimum incomplete binary tree means that all leaf nodes are the above four types of nodes, and the number of nodes of the tree is the minimum. The specific generation process includes: recursively generating node types for each layer of the complete binary tree (as shown in FIG. 2) from bottom (first layer) to top (topmost layer).

For a first layer, if both two child nodes of a node are frozen bits, then the node is recorded as a Rate0 node; if both two child nodes of a node are information bits, then the node is recorded as a Rate1 node; if a left child node of a node is a frozen bit and a right child node of the node is an information bit, then the node is recorded as an REP node; if a left child node of a node is an information bit and a right child node of the node is a frozen bit, then the node is recorded as a node that is not of the four types.

For a second layer, if both two child nodes of a node are Rate0 nodes, then the node is recorded as a Rate0 node; if both two child nodes of a node are Rate1 nodes, then the node is recorded as a Rate1 node; if a left child node of a node is a Rate0 node and a right child node of the node is an REP node, then the node is recorded as an REP node; if a left child node of a node is an REP node and a right child node of a node is a Rate1 node, then the node is recorded as an SPC node; otherwise, a node is recorded as a node that is not of the four types.

For each layer of a third layer to a topmost layer from bottom to top, if both two child nodes of a node are Rate0 nodes, then the node is recorded as a Rate0 node; if both two child nodes of a node are Rate1 nodes, then the node is recorded as a Rate1 node; if a left child node of a node is a Rate0 node and a right child node of the node is an REP node, then the node is recorded as an REP node; if a left child node of a node is an SPC node and a right child node of the node is a Rate1 node, then the node is recorded as an SPC node; otherwise, a node is recorded as a node that is not of the four types.

At this point, one complete binary tree is coalesced into the smallest incomplete binary tree.

Step 502: interleaving one CRC check bit to a position of a last bit in a bit sequence of any one of Rate1 node, REP node and SPC node with a sequence of information bits originally at and after the position shifted backward by one bit.

Figure 6:
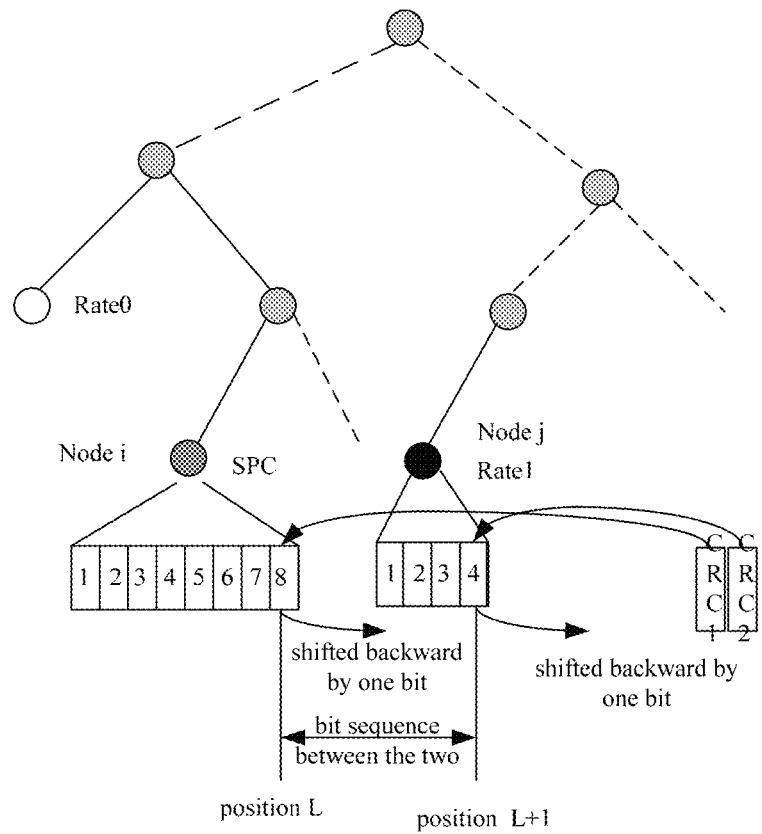
FIG. 6 is a second schematic diagram of coding polar codes according to an embodiment of the present disclosure.

As shown in FIG. 6, Node i is an SPC node, which is composed of 8 code bits. A check bit CRC1 is interleaved to a last bit (i.e., eighth bit), and information bit originally at the eight bit and a subsequent bit sequence are shifted backward by 1 bit. Similarly, a check bit CRC2 is interleaved to a last bit (i.e., fourth bit) of Node j which is a Rate1 node, and information bit originally at the fourth bit and a subsequent bit sequence are shifted backward by 1 bit.

Step 502 is repeated until all X CRC bits are interleaved (X is set by the project, and its value may be 1 to 24). In this repeating process, orders of the original CRC are not changed, for example, as shown in FIG. 5, CRC1 still ranks before CRC2.

Step 503: according to the position where the interleaved CRC check bit is located, determining a value of the interleaved CRC check bit by all or some of bits preceding the position, and filling the value to the bit at this position.

As shown in FIG. 6, a value of a CRC bit at a first position (L is equal to 1) is generated by all information bits preceding the first position. A value of a CRC bit at an L-th position (L is greater than or equal to 2) is determined by all or some of information bits preceding the L-th position. Particularly, all information bits between the L-th position and a (L+1)-th position are used to generate a value of a CRC bit at the (L+1)-th position.

The method for generating the CRC according to a sequence of information bits has various implementation methods in related technologies, and details are not described herein again. In the related art, there are various implementation methods for generating a value of CRC according to a piece of information bit sequence, which will not be repeated here.

In practical applications, an encoder capable of implementing the above coding method can be used for coding. The encoder first performs polar coding on input source bits, then fills all or some of CRC check bits into specific positions in a code sequence in interleaving manner according to the above method for interleaving check bits, and finally transmitted a coded sequence to a decoder. Particularly, in order to further improve decoding efficiency, the encoder also transmits positions of the above CRC check bits filled in interleaving manner to the decoder.

The encoder is illustrated hereinafter with an example.

An input sequence of the encoder is a payload of length K=109. The encoder first performs CRC coding with a CRC generation matrix: $G_{crc19(D)}=D^{19}+D^{17}+D^{13}+D^{11}+D^9+D^8+D^6+D^5+D^4+D^3+1$.

After adding the CRC check bits, the length of the payload is K=128. Three bits of the CRC check bits are selected to be interleaved into the coding sequence. Finally, the encoder performs polar code coding and bit interleaving according to the protocol to obtain a coded sequence of a code length N=256.

Figure 7:
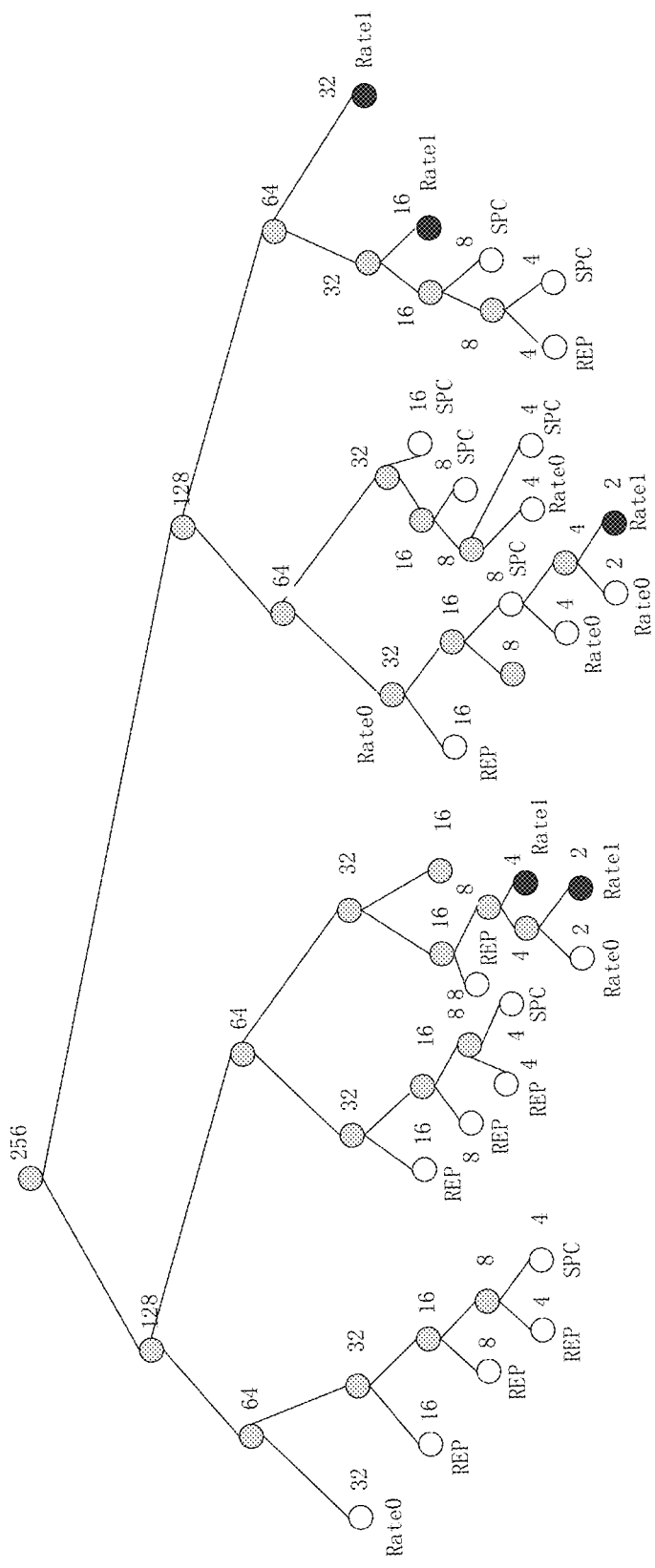
FIG. 7 is a schematic diagram of a non-complete binary tree of a decoding method according to an embodiment of the present disclosure.

Correspondingly, one embodiment of the present disclosure further provides a decoder for performing the polar code decoding method in the embodiment of the present disclosure. The decoder receives in advance positions of CRC check bits filled in interleaving manner and then decodes a received soft bit. First, the decoder coalesces a decoded binary tree of the polar code into a minimum incomplete binary tree (as shown in FIG. 7). Then, four types of nodes are decoded one by one, specifically including updating soft bit value calculation and feedback calculation of a hard decision result.

Figure 8:
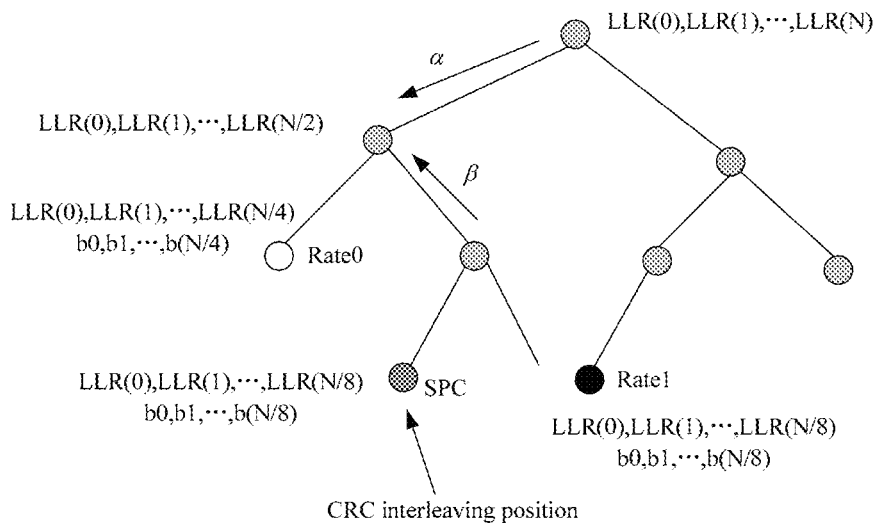
FIG. 8 is a schematic diagram of decoding polar codes according to an embodiment of the present disclosure.

As shown in FIG. 8, in the decoding process, when the position of the interleaving filled CRC check bit is encountered (such as the SPC node in the drawing), the decoder does not need to perform CRC check after the bit sequence of the hard decision is expanded. Instead, CRC check is performed directly on the first bit (b0 in the drawing) of the hard decision. If the check is successful, a decoding path is reserved, otherwise the decoding path is deleted. When all decoding paths are deleted, the decoding ends early.

The solution of the embodiment of the present disclosure can be applied to channel coding and decoding technologies of communication systems (such as 3G, 4G, and 5G communication systems).

Figure 9:
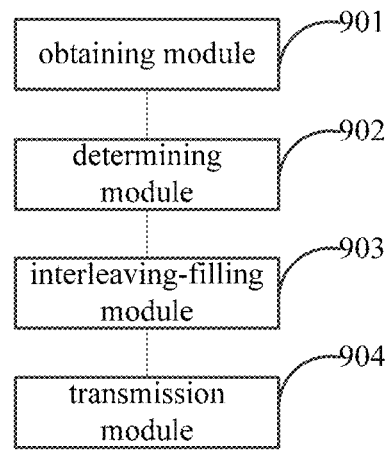
FIG. 9 is a schematic diagram of a polar code coding apparatus according to an embodiment of the present disclosure.

As shown in FIG. 9, a polar code coding apparatus of one embodiment of the present disclosure includes:

an obtaining module 901 configured to obtain a plurality of CRC check bits;

a determining module 902 configured to determine an interleaved padding position in a to-be-coded sequence;

an interleaving-filling module 903 configured to fill a first predetermined number of CRC check bits of the plurality of CRC check bits into the interleaved padding position in the to-be-coded sequence in an interleaving manner;

a transmission module 904 configured to perform polar coding on the to-be-coded sequence that is filled with the predetermined number of CRC check bits in interleaving manner and transmit a coded sequence to a receiving end.

The first predetermined number is less than or equal to a total number of the plurality of CRC check bits.

The interleaving-filling module 903 includes:

a first processing sub-module configured to coalesce a complete binary tree corresponding to a polar codeword into a minimum incomplete binary tree, and determine to-be-processed nodes in the minimum incomplete binary tree, where the to-be-processed nodes include at least one type of nodes among Rate0 node, Rate1 node, REP node or SPC node; a determining sub-module configured to interleave the CRC check bits in the first predetermined number of CRC check bits to a position of the last bit in a bit sequence of any one of the to-be-processed nodes; an interleaving-filling sub-module configured to, according to the padding position where the interleaved CRC check bit is located, determine a CRC check bit value of the interleaved CRC check bit at the padding position and fill the value to the padding position.

The interleaved padding position meets the following conditions: $L=2^{N_1}+2^{N_2}+\ldots 2^{N_n}$, where $N_1 \ldots N_n$ are arbitrary integers. A first CRC check bit that is filled into a first padding position in an interleaving manner, is generated by all bits preceding the first padding position in the to-be-coded sequence. A second CRC check bit that is filled into an X-th padding position except for the first padding position, is generated by all bits which are between a CRC check bit at a (X−1)-th padding position and the X-th padding position; or, the second CRC check bit that is filled into the X-th padding position except for the first padding position, is generated by all bits which are between the CRC check bit at the (X−1)-th padding position and the X-th padding position as well as a third predetermined number of bits preceding the (X−1)-th padding position. The third predetermined number is less than or equal to a total number of bits preceding the (X−1)-th padding position, where X is an integer greater than two.

Specifically, the first processing sub-module is configured to, in a first layer of the complete binary tree, if both two child nodes of a first target node are frozen bits, determine the first target node as a Rate0 node; if both two child nodes of the first target node are information bits, determine the first target node as a Rate1 node; if a left child node of the first target node is a frozen bit and a right child node of the first target node is an information bit, determine the first target node as an REP node; if the left child node of the first target node is an information bit and a right child node of the first target node is a frozen bit, determine the first target node as a node that is not of the four types;

in a second layer of the complete binary tree, if both two child nodes of a second target node are Rate0 nodes, determine the second target node as a Rate0 node; if both two child nodes of the second target node are Rate1 nodes, determine the second target node as a Rate1 node; if a left child node of the second target node is a Rate0 node and a right child node of the second target node is an REP node, determine the second target node as an REP node; if the left child node of the second target node is an REP node and the right child node of the first target node is a Rate1 node, determine the second target node as an SPC node; otherwise, determine the second target node as a node that is not of the four types;

for each layer of a third layer to a topmost layer of the complete binary tree from bottom to top, if both two child nodes of a third target node are Rate0 nodes, determine the third target node as a Rate0 node; if both two child nodes of the third target node are Rate1 nodes, determine the third target node as a Rate1 node; if a left child node of the third target node is a Rate0 node and a right child node of the third target node is an REP node, determine the third target node as an REP node; if the left child node of the third target node is an SPC node and the right child node of the third target node is a Rate1 node, determine the third target node as an SPC node; otherwise, determine the third target node as a node that is not of the four types.

Figure 10:
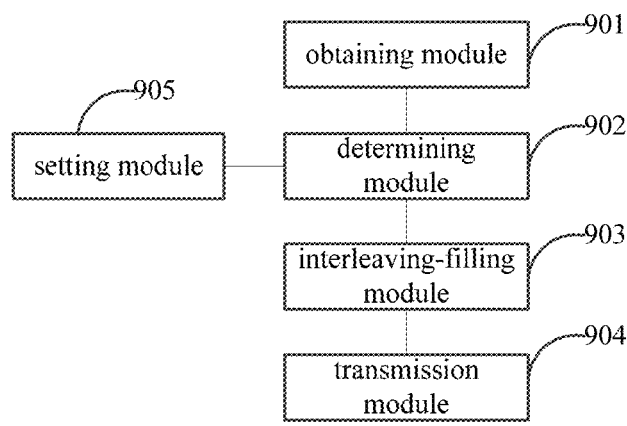
FIG. 10 is a block diagram of a polar code coding apparatus according to an embodiment of the present disclosure.

In order to further improve the decoding efficiency, the transmission module is further configured to transmit information of the interleaved padding position to the receiving end. Or, as shown in FIG. 10, the apparatus further includes a setting module 905 configured to pre-arrange information of the interleaved padding position with the receiving end.

The operation principle of the apparatus of the present disclosure may be referred to the description of the foregoing method embodiments.

In one embodiment of the present disclosure, in the coding process, the CRC check bits are filled into the interleaved padding position in the to-be-coded sequence in interleaving manner, and then the to-be-coded sequence is coded, so that when the decoding end performs decoding, combination of decoding process and CRC check process can be performed, thereby reducing decoding delay and reducing decoding complexity.

Figure 11:
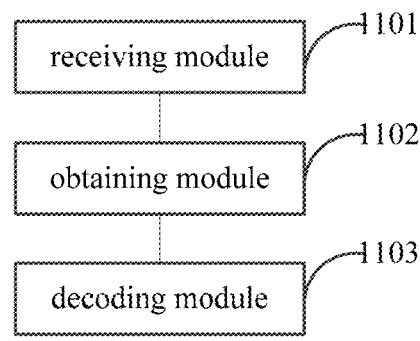
FIG. 11 is a block diagram of a polar coded coding apparatus according to an embodiment of the present disclosure.

As shown in FIG. 11, a polar code decoding apparatus according to one embodiment of the present disclosure includes:

a receiving module 1101 configured to receive a coded sequence transmitted by a transmitting end; an obtaining module 1102 configured to obtain information of an interleaved padding position of a CRC check bit in the coded sequence; and a decoding module 1103 configured to decode the coded sequence according to the information of the interleaved padding position.

The decoding module 1103 includes:

a second processing sub-module configured to, according to the coded sequence, coalesce a decoding binary tree corresponding to the coded sequence into a minimum incomplete binary tree, and determine to-be-processed nodes in the minimum incomplete binary tree, where the to-be-processed nodes include at least one type of nodes among Rate0 node, Rate1 node, REP node or SPC node; and a decoding sub-module configured to decode the to-be-processed node according to the information of the interleaved padding position.

Specifically, the decoding sub-module includes:

a calculating unit configured to perform updating soft bit value calculation and feedback calculation of the hard decision result for the to-be-processed node; a check unit configured to, when it is determined that the to-be-processed node is filled with a CRC check bit in interleaving manner according to the information of the interleaved padding position, perform CRC check on a first bit in the hard decision result of the to-be-processed node; a first processing unit configured to reserve a decoding path corresponding to the to-be-processed node when the CRC check is successful, and delete a decoding path corresponding to the to-be-processed node when the CRC check is unsuccessful; and a second processing unit configured to end decoding when decoding paths of all to-be-processed nodes are deleted.

In one embodiment of the present disclosure, the obtaining module 1102 is specifically configured to: receive the information of the interleaved padding position of the CRC check bit in the coded sequence transmitted by the transmitting end; or, receive the information of the interleaved padding position of the CRC check bit in the coded sequence according to a pre-agreement with the transmitting end.

The operation principle of the apparatus of the present disclosure may be referred to the description of the foregoing method embodiments.

In one embodiment of the present disclosure, in the coding process, the CRC check bits are filled into the interleaved padding position in the to-be-coded sequence in interleaving manner, and then the to-be-coded sequence is coded, so that when a decoding end performs decoding, combination of decoding process and CRC check process can be performed, thereby reducing decoding delay and reducing decoding complexity.

Figure 12:
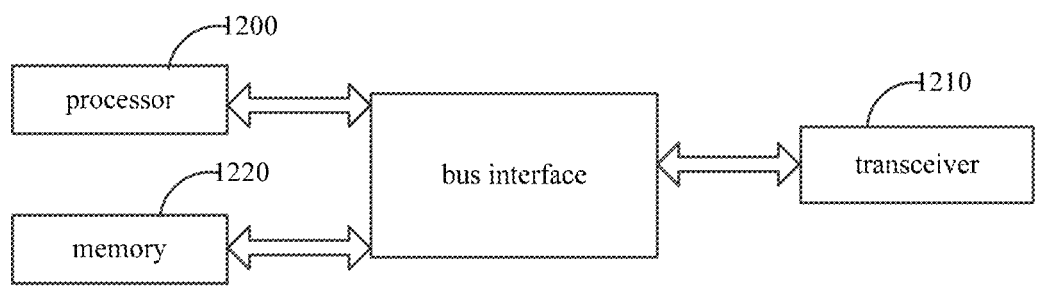
FIG. 12 is a schematic diagram of a polar code coding device according to an embodiment of the present disclosure.

As shown in FIG. 12, a polar code coding device according to one embodiment of the present disclosure includes:

a processor 1200 configured to read a program in a memory 1220 to perform the following process: obtaining a plurality of CRC check bits; determining an interleaved padding position in a to-be-coded sequence; filling a first predetermined number of CRC check bits of the plurality of CRC check bits into the interleaved padding position in the to-be-coded sequence in an interleaving manner; performing polar coding on the to-be-coded sequence that is filled with the predetermined number of CRC check bits in interleaving manner;

a transceiver 1210 configured to transmit a coded sequence to a receiving end under the control of the processor 1200.

The first predetermined number is less than or equal to a total number of the plurality of CRC check bits.

In FIG. 12, a bus architecture may include any number of interconnected buses and bridges. Specifically, one or more processors demonstrated with processor 1200 are coupled with various circuits of memory, which is demonstrated with memory 1220. The bus architecture may also link various other circuits, such as, peripherals, voltage regulators, and power management circuits, as is known in the art. Thus, in the application, no further description is provided. The bus interface provides an interface. The transceiver 1210 may be composed of multiple components, that is, including a transmitter and a receiver, which provide a unit for communicating with various other devices via the transmitting medium.

The processor 1200 is in charge of managing bus architecture and general processing. The memory 1220 may store data used when the processor 1200 performs operations.

The processor 1200 is further configured to read the computer program to perform the following steps:

coalescing a complete binary tree corresponding to a polar codeword into a minimum incomplete binary tree, and determining to-be-processed nodes in the minimum incomplete binary tree, where the to-be-processed nodes include at least one type of nodes among Rate0 node, Rate1 node, REP node or SPC node;

interleaving the CRC check bits in the first predetermined number of CRC check bits to a position of the last bit in a bit sequence of any one of the to-be-processed nodes;

according to the padding position where the interleaved CRC check bit is located, determining a CRC check bit value of the interleaved CRC check bit at the padding position and filling the value to the padding position.

The interleaved padding position meets the following conditions: $L=2^{N_1}+2^{N_2}+\ldots 2^{N_n}$, where $N_1 \ldots N_n$ are arbitrary integers.

A first CRC check bit that is filled into a first padding position in an interleaving manner, is generated by all bits preceding the first padding position in the to-be-coded sequence.

A second CRC check bit that is filled into an X-th padding position except for the first padding position, is generated by all bits which are between a CRC check bit at a (X−1)-th padding position and the X-th padding position; or, the second CRC check bit that is filled into the X-th padding position except for the first padding position, is generated by all bits which are between the CRC check bit at the (X−1)-th padding position and the X-th padding position as well as a third predetermined number of bits preceding the (X−1)-th padding position. The third predetermined number is less than or equal to a total number of bits preceding the (X−1)-th padding position, where X is an integer greater than two.

The processor 1200 is further configured to read the computer program to perform the following steps:

in a first layer of the complete binary tree, if both two child nodes of a first target node are frozen bits, determining the first target node as a Rate0 node; if both two child nodes of the first target node are information bits, determining the first target node as a Rate1 node; if a left child node of the first target node is a frozen bit and a right child node of the first target node is an information bit, determining the first target node as an REP node; if the left child node of the first target node is an information bit and a right child node of the first target node is a frozen bit, determining the first target node as a node that is not of the four types;

in a second layer of the complete binary tree, if both two child nodes of a second target node are Rate0 nodes, determining the second target node as a Rate® node; if both two child nodes of the second target node are Rate1 nodes, determining the second target node as a Rate1 node; if a left child node of the second target node is a Rate0 node and a right child node of the second target node is an REP node, determining the second target node as an REP node; if the left child node of the second target node is an REP node and the right child node of the first target node is a Rate1 node, determining the second target node as an SPC node; otherwise, determining the second target node as a node that is not of the four types;

for each layer of a third layer to a topmost layer of the complete binary tree from bottom to top, if both two child nodes of a third target node are Rate0 nodes, determining the third target node as a Rate0 node; if both two child nodes of the third target node are Rate1 nodes, determining the third target node as a Rate1 node; if a left child node of the third target node is a Rate0 node and a right child node of the third target node is an REP node, determining the third target node as an REP node; if the left child node of the third target node is an SPC node and the right child node of the third target node is a Rate1 node, determining the third target node as an SPC node; otherwise, determining the third target node as a node that is not of the four types.

The transceiver is further configured to transmit information of the interleaved padding position to the receiving end. Or, the processor is further configured to read a program in the memory to perform the following process: pre-arranging with the receiving end the information of the interleaved padding position.

Figure 13:
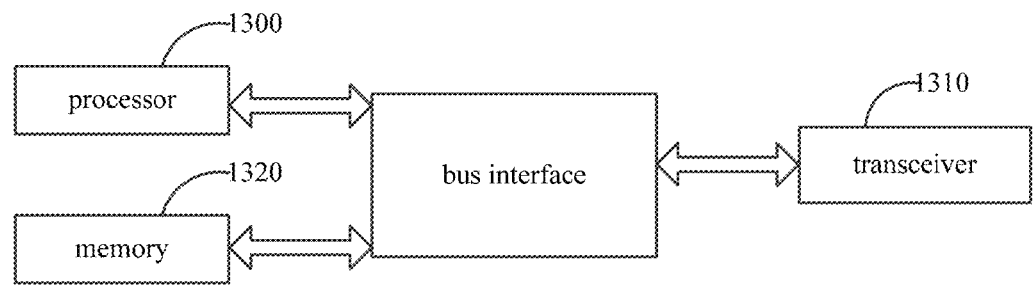
FIG. 13 is a schematic diagram of a polar code decoding device according to an embodiment of the present disclosure.

As shown in FIG. 13, a polar code decoding device according to one embodiment of the present disclosure includes:

a processor 1300 configured to read a program in a memory 1320 to perform the following process:

obtaining information of an interleaved padding position of a CRC check bit in the coded sequence; and decoding a coded sequence according to the information of the interleaved padding position;

a transceiver 1310 configured to receive a coded sequence transmitted by a transmitting end under control of the processor 1300.

The first predetermined number is less than or equal to a total number of the plurality of CRC check bits.

In FIG. 13, a bus architecture may include any number of interconnected buses and bridges. Specifically, one or more processors demonstrated with processor 1300 are coupled with various circuits of memory, which is demonstrated with memory 1320. The bus architecture may also link various other circuits, such as, peripherals, voltage regulators, and power management circuits, as is known in the art. Thus, in the application, no further description is provided. The bus interface provides an interface. The transceiver 1310 may be composed of multiple components, that is, including a transmitter and a receiver, which provide a unit for communicating with various other devices via the transmitting medium.

The processor 1300 is in charge of managing bus architecture and general processing. The memory 1320 may store data used when the processor 1300 performs operations.

The processor 1300 is further configured to read the computer program to perform the following process:

according to the coded sequence, coalescing a decoding binary tree corresponding to the coded sequence into a minimum incomplete binary tree, and determining to-be-processed nodes in the minimum incomplete binary tree, where the to-be-processed nodes include at least one type of nodes among Rate0 node, Rate1 node, REP node or SPC node; and decoding the to-be-processed node according to the information of the interleaved padding position.

The processor 1300 is further configured to read the computer program to perform the following process:

performing updating soft bit value calculation and feedback calculation of the hard decision result for the to-be-processed node;

when it is determined that the to-be-processed node is filled with a CRC check bit in interleaving manner according to the information of the interleaved padding position, performing CRC check on a first bit in the hard decision result of the to-be-processed node;

reserving a decoding path corresponding to the to-be-processed node when the CRC check is successful, and deleting a decoding path corresponding to the to-be-processed node when the CRC check is unsuccessful; and ending decoding when decoding paths of all to-be-processed nodes are deleted.

The transceiver 1310 is further configured to receive the information of the interleaved padding position of the CRC check bit in the coded sequence transmitted by the transmitting end; or, the processor 1300 is further configured to read the computer program to perform the following process: receiving the information of the interleaved padding position of the CRC check bit in the coded sequence according to a pre-agreement with the transmitting end.

Furthermore, a computer readable storage medium according to one embodiment of the present disclosure is configured to store a computer program executable by a processor to implement the following steps:

obtaining a plurality of CRC check bits;

determining an interleaved padding position in a to-be-coded sequence;

filling a first predetermined number of CRC check bits of the plurality of CRC check bits into the interleaved padding position in the to-be-coded sequence in an interleaving manner;

performing polar coding on the to-be-coded sequence that is filled with the predetermined number of CRC check bits in interleaving manner, and transmitting a coded sequence to a receiving end.

The first predetermined number is less than or equal to a total number of the plurality of CRC check bits.

The filling a first predetermined number of CRC check bits of the plurality of CRC check bits into the interleaved padding position in the to-be-coded sequence in an interleaving manner, includes:

coalescing a complete binary tree corresponding to a polar codeword into a minimum incomplete binary tree, and determining to-be-processed nodes in the minimum incomplete binary tree, where the to-be-processed nodes include at least one type of nodes among Rate0 node, Rate1 node, REP node or SPC node;

interleaving the CRC check bits in the first predetermined number of CRC check bits to a position of the last bit in a bit sequence of any one of the to-be-processed nodes;

according to the padding position where the interleaved CRC check bit is located, determining a CRC check bit value of the interleaved CRC check bit at the padding position and filling the value to the padding position.

The interleaved padding position meets the following conditions: $L=2^{N_1}+2^{N_2}+\ldots 2^{N_n}$, where $N_1 \ldots N_n$ are arbitrary integers.

A first CRC check bit that is filled into a first padding position in an interleaving manner, is generated by all bits preceding the first padding position in the to-be-coded sequence.

A second CRC check bit that is filled into an X-th padding position except for the first padding position, is generated by all bits which are between a CRC check bit at a (X−1)-th padding position and the X-th padding position; or, the second CRC check bit that is filled into the X-th padding position except for the first padding position, is generated by all bits which are between the CRC check bit at the (X−1)-th padding position and the X-th padding position as well as a third predetermined number of bits preceding the (X−1)-th padding position. The third predetermined number is less than or equal to a total number of bits preceding the (X−1)-th padding position, where X is an integer greater than two.

The coalescing a complete binary tree corresponding to a polar codeword into a minimum incomplete binary tree, and determining to-be-processed nodes in the minimum incomplete binary tree, where the to-be-processed nodes include at least one type of nodes among Rate0 node, Rate1 node, REP node or SPC node, includes:

in a first layer of the complete binary tree, if both two child nodes of a first target node are frozen bits, determining the first target node as a Rate0 node; if both two child nodes of the first target node are information bits, determining the first target node as a Rate1 node; if a left child node of the first target node is a frozen bit and a right child node of the first target node is an information bit, determining the first target node as an REP node; if the left child node of the first target node is an information bit and a right child node of the first target node is a frozen bit, determining the first target node as a node that is not of the four types;

in a second layer of the complete binary tree, if both two child nodes of a second target node are Rate0 nodes, determining the second target node as a Rate0 node; if both two child nodes of the second target node are Rate1 nodes, determining the second target node as a Rate1 node; if a left child node of the second target node is a Rate0 node and a right child node of the second target node is an REP node, determining the second target node as an REP node; if the left child node of the second target node is an REP node and the right child node of the first target node is a Rate1 node, determining the second target node as an SPC node; otherwise, determining the second target node as a node that is not of the four types;

for each layer of a third layer to a topmost layer of the complete binary tree from bottom to top, if both two child nodes of a third target node are Rate0 nodes, determining the third target node as a Rate0 node; if both two child nodes of the third target node are Rate1 nodes, determining the third target node as a Rate1 node; if a left child node of the third target node is a Rate0 node and a right child node of the third target node is an REP node, determining the third target node as an REP node; if the left child node of the third target node is an SPC node and the right child node of the third target node is a Rate1 node, determining the third target node as an SPC node; otherwise, determining the third target node as a node that is not of the four types.

The computer program is executable by the processor to further implement the following steps:

transmitting information of the interleaved padding position to the receiving end; or, pre-arranging with the receiving end the information of the interleaved padding position.

In addition, a computer readable storage medium according to one embodiment of the present disclosure is configured to store a computer program executable by a processor to implement the following steps:

receiving a coded sequence transmitted by a transmitting end;

obtaining information of an interleaved padding position of a CRC check bit in the coded sequence; and decoding the coded sequence according to the information of the interleaved padding position.

The decoding the coded sequence according to the information of the interleaved padding position, includes:

according to the coded sequence, coalescing a decoding binary tree corresponding to the coded sequence into a minimum incomplete binary tree, and determining to-be-processed nodes in the minimum incomplete binary tree, where the to-be-processed nodes include at least one type of nodes among Rate0 node, Rate1 node, REP node or SPC node; and decoding the to-be-processed node according to the information of the interleaved padding position.

The decoding the to-be-processed node according to the information of the interleaved padding position, includes:

performing updating soft bit value calculation and feedback calculation of the hard decision result for the to-be-processed node;

when it is determined that the to-be-processed node is filled with a CRC check bit in interleaving manner according to the information of the interleaved padding position, performing CRC check on a first bit in the hard decision result of the to-be-processed node;

reserving a decoding path corresponding to the to-be-processed node when the CRC check is successful, and deleting a decoding path corresponding to the to-be-processed node when the CRC check is unsuccessful; and ending decoding when decoding paths of all to-be-processed nodes are deleted.

The obtaining information of an interleaved padding position of a CRC check bit in the coded sequence, includes:

receiving the information of the interleaved padding position of the CRC check bit in the coded sequence transmitted by the transmitting end; or, obtaining the information of the interleaved padding position of the CRC check bit in the coded sequence according to a pre-agreement with the transmitting end.

In the embodiments of the application, it should be understood that, the disclosed device and method may be implemented by using other methods. For example, device embodiments described above are only illustrative, e.g., division of the unit is only a logical division, there may be additional division methods during actual implementation. For example, multiple units or components may be combined, or integrated into another system. Alternatively, some features may be omitted, or not performed. From another point of view, the mutual coupling shown or discussed, or direct coupling, or communication connection may be through some interfaces. The indirect coupling, or communication connection among devices or units may be electronic, mechanical, or in other form.

In addition, in various embodiments of the present disclosure, each functional unit may be integrated into one processing unit. Alternatively, each unit may exist physically alone. Still alternatively, two or more units may be integrated into one unit. The above integrated unit may be implemented in the form of hardware, or in the form of hardware plus software functional units.

The above integrated unit implemented in the form of a software functional unit may be stored in a computer-readable storage medium. The software functional unit is stored in a storage medium, which includes several instructions to enable a computer device (which may be a Personal Computer (PC), a server, or a network device, and so on) to execute all the blocks, or some blocks in a method of each embodiment in the present disclosure. The foregoing storage medium includes a U disk, a mobile hard disk, a Read-Only Memory (ROM), a Random Access Memory (RAM), a disk, or a Compact Disk (CD), or various mediums which may store program codes.

Foregoing describes optional implementation modes of the present disclosure. It should be pointed out that, for persons having ordinary skill in the art, several improvements and changes may be made, without departing from the principle of the present disclosure. These improvements and changes should also be within the scope of the present disclosure.

What is claimed is:

1. A polar code coding method comprising:
   obtaining a plurality of CRC check bits;
   determining interleaved positions in a to-be-coded sequence;
   filling a first predetermined number of CRC check bits of the plurality of CRC check bits into the interleaved positions in the to-be-coded sequence in an interleaving manner; and
   performing polar coding on the to-be-coded sequence that is filled with the predetermined number of CRC check bits in interleaving manner, and transmitting a coded sequence to a receiving end;
   wherein the filling a first predetermined number of CRC check bits of the plurality of CRC check bits into the interleaved positions in the to-be-coded sequence in an interleaving manner, includes:
   reducing a complete binary tree corresponding to a polar codeword into a minimum incomplete binary tree, and determining to-be-processed nodes in the minimum incomplete binary tree, wherein the to-be-processed nodes include at least one type of nodes among Rate0 node, Rate1 node, REP node or SPC node;
   interleaving the CRC check bits in the first predetermined number of CRC check bits to positions of last bits in bit sequences of any one of the to-be-processed nodes; wherein the any one of the to-be-processed nodes includes at least one type of nodes among Rate1 node, REP node or SPC node:
   according to a position where an interleaved CRC check bit is located, determining a CRC check bit value of the interleaved CRC check bit at the position and filling the value to the position:
   wherein the minimum incomplete bin tree means that all leaf nodes of the minimum incomplete binary tree Rate0 node, Rate1 node, REP node or SPC node, and the minimum incomplete binary tree has minimum number of nodes:

for a first layer of the complete binary tree, if both two child nodes of a node are frozen bits, then the node is recorded as a Rate0 node: if both two child nodes of a node are information bits then the node is recorded as a Rate1 node; if a left child node of a node is a frozen bit and a right child node of the node is an information bit, then the node is recorded as an REP node; if a left child node of a node is an information bit and a right child node of the node is a frozen bit, then the node is recorded as a node that is not of the four types;

for a second layer of the complete binary tree, if both two child nodes of a node are Rate0 nodes then the node is recorded as a Rate0 node; if both two child nodes of a node are Rate1 nodes, then the node is recorded as a Rate1 node; if a left child node of a node is a Rate0 node and a right child node of the node is an REP node, then the node is recorded as an REP node; if a left child node of a node is an REP node and a right child node of a node is a Rate1 node, then the node is recorded as an SPC node; otherwise, a node is recorded as a node that is not of the four types;

for each layer of a third layer to a topmost layer from bottom to top of the complete binary tree, if both two child nodes of a node are Rate0 nodes, then the node is recorded as a Rate0 node; if both two child nodes of a node are Rate1 nodes, then the node is recorded as a Rate1 node; if a left child node of a node is a Rate0 node and a right child node of the node is an REP node, then the node is recorded as an REP node; if a left child node of a node is an SPC node and a right child node of the node is a Rate1 node, then the node is recorded as an SPC node; otherwise, a node is recorded as a node that is not of the four types.

2. The method according to claim 1, wherein an interleaved position L meets the following conditions: $L=2^{N_1}+2^{N_2}+\ldots 2^{N_n}$, wherein $N_1 \ldots N_n$ are arbitrary integers; a value of L is less than or equal to a sum of a length of the to-be-coded sequence and a length of the first predetermined number of CRC check bits;

a first CRC check bit that is filled into a first position in an interleaving manner, is generated by all bits preceding the first position in the to-be-coded sequence;

a second CRC check bit that is filled into an X-th position except for the first position, is generated by all bits which are between a CRC check bit at a (X-1)-th position and the X-th position; the second CRC check bit is generated through a CRC generation matrix: $G_{crc19(D)} = D^{19}+D^{17}+D^{13}+D^{11}+D^9+D^8+D^6+D^5+D^4+D^3+1$; or, the second CRC check bit that is filled into the X-th position except for the first position, is generated by all bits which are between the CRC check bit at the (X-1)-th position and the X-th position as well as a third predetermined number of bits preceding the (X-1)-th position; wherein the third predetermined number is less than or equal to a total number of bits preceding the (X-1)-th position; wherein X is an integer greater than two.

3. The method according to claim 1, wherein the reducing a complete binary tree corresponding to a polar codeword into a minimum incomplete binary tree, and determining to-be-processed nodes in the minimum incomplete binary tree, wherein the to-be-processed nodes include at least one type of nodes among Rate0 node, Rate1 node, REP node or SPC node, includes:

in a first layer of the complete binary tree, if both two child nodes of a first target node are frozen bits, determining the first target node as a Rate0 node; if both two child nodes of the first target node are information bits, determining the first target node as a Rate1 node; if a left child node of the first target node is a frozen bit and a right child node of the first target node is an information bit, determining the first target node as an REP node; if the left child node of the first target node is an information bit and a right child node of the first target node is a frozen bit, determining the first target node as a node that is not of the four types;

in a second layer of the complete binary tree, if both two child nodes of a second target node are Rate0 nodes, determining the second target node as a Rate0 node; if both two child nodes of the second target node are Rate1 nodes, determining the second target node as a Rate1 node; if a left child node of the second target node is a Rate0 node and a right child node of the second target node is an REP node, determining the second target node as an REP node; if the left child node of the second target node is an REP node and the right child node of the first target node is a Rate1 node, determining the second target node as an SPC node; otherwise, determining the second target node as a node that is not of the four types;

for each layer of a third layer to a topmost layer of the complete binary tree from bottom to top, if both two child nodes of a third target node are Rate0 nodes, determining the third target node as a Rate0 node; if both two child nodes of the third target node are Rate1 nodes, determining the third target node as a Rate1 node; if a left child node of the third target node is a Rate0 node and a right child node of the third target node is an REP node, determining the third target node as an REP node; if the left child node of the third target node is an SPC node and the right child node of the third target node is a Rate1 node, determining the third target node as an SPC node; otherwise, determining the third target node as a node that is not of the four types.

4. The method according to claim 1, wherein the method further includes:

transmitting information of the interleaved positions to the receiving end; or, pre-agreeing the information of the interleaved positions with the receiving end.

5. A polar code decoding method comprising:

receiving a coded sequence transmitted by a transmitting end;

obtaining information of an interleaved position of a CRC check bit in the coded sequence; and decoding the coded sequence according to the information of the interleaved position;

wherein the transmitting end fills a first predetermined number of CRC check bits of CRC check bits into the interleaved positions in the to-be-coded sequence in an interleaving manner in a way including:

reducing a complete binary tree to a polar codeword into a minimum incomplete binary tree, and determining to-be-processed nodes in the minimum incomplete binary tree, wherein the to-be-processed nodes include at least one type of nodes among Rate0 node, Rate1 node, REP node or SPC node;

interleaving the CRC check bits in the first predetermined number of CRC check bits to positions of last bits in bit sequences of any one of the to-be-processed nodes; wherein the any one of the to-be-processed nodes includes at least one type of nodes among Rate1 node, REP node or SPC node;

according to a position where an interleaved CRC check bit is located, determining a CRC check bit value of the interleaved CRC check bit at the position and filling the value to the position;

wherein the minimum incomplete binary tree means that all leaf nodes of the minimum incomplete binary tree Rate0 node, Rate1 node, REP node or SPC node, and the minimum incomplete binary tree has minimum number of nodes;

for a first layer of the complete binary tree, if both two child nodes of a node are frozen bits, then the node is recorded as a Rate0 node; if both two child nodes of a node are information bits, then the node is recorded as a Rate1 node; if a left child node of a node is a frozen bit and a right child node of the node is an information bit, then the node is recorded as an REP node; if a left child node of a node is an information bit and a right child node of the node is a frozen bit, then the node is recorded as a node that is not of the four types:

for a second layer of the complete binary tree, if both two child nodes of a node are Rate0 nodes, then the node is recorded as a Rate0 node; if both two child nodes of a node are Rate1 nodes, then the node is recorded as a Rate1 node; if a left child node of a node is a Rate0 node and a right child node of the node is an REP node, then the node is recorded as an REP node; if a left child node of a node is an REP node and a right child node of a node is a Rate1 node, then the node is recorded as an SPC node; otherwise, a node is recorded as a node that is not of the four types:

for each layer of a third layer to a topmost layer from bottom to top of the complete binary tree, if both two child nodes of a node are Rate0 nodes, then the node is recorded as a Rate0 node; if both two child nodes of a node are Rate1 nodes, then the node is recorded as a Rate1 node; if a left child node of a node is a Rate0 node and a right child node of the node is an REP node, then the node is recorded as an REP node; if a left child node of a node is an SPC node and a right child node of the node is a Rate1 node, then the node is recorded as an SPC node; otherwise, a node is recorded as a node that is not of the four types.

6. The method according to claim 5, wherein the decoding the coded sequence according to the information of the interleaved position, includes:

according to the coded sequence, reducing a decoding binary tree corresponding to the coded sequence into a minimum incomplete binary tree, and determining to-be-processed nodes in the minimum incomplete binary tree, wherein the to-be-processed nodes include at least one type of nodes among Rate0 node, Rate1 node, REP node or SPC node; and decoding the to-be-processed nodes according to the information of the interleaved position.

7. The method according to claim 6, wherein the decoding the to-be-processed nodes according to the information of the interleaved position, includes:

performing updating soft bit value calculation and feedback calculation of the hard decision result for the to-be-processed node;

when determining that the to-be-processed node is filled with a CRC check bit in interleaving manner according to the information of the interleaved position, performing CRC check on a first bit in a hard decision result of the to-be-processed node;

reserving a decoding path corresponding to the to-be-processed node when the CRC check is successful, and deleting a decoding path corresponding to the to-be-processed node when the CRC check is unsuccessful; and ending decoding when decoding paths of all the to-be-processed nodes are deleted.

8. The method according to claim 5, wherein the obtaining information of an interleaved position of a CRC check bit in the coded sequence, includes:

receiving the information of the interleaved position of the CRC check bit in the coded sequence transmitted by the transmitting end; or, obtaining the information of the interleaved position of the CRC check bit in the coded sequence according to a pre-agreement with the transmitting end.

9. A polar code coding device comprising: a transceiver, a memory, a processor and a computer program stored on the memory and executable on the processor;

wherein the processor is configured to read the program in the memory to perform the following process: obtaining a plurality of CRC check bits; determining interleaved positions in a to-be-coded sequence; filling a first predetermined number of CRC check bits of the plurality of CRC check bits into the interleaved positions in the to-be-coded sequence in an interleaving manner; performing polar coding on the to-be-coded sequence that is filled with the predetermined number of CRC check bits in interleaving manner;

the transceiver is configured to transmit a coded sequence to a receiving end;

wherein the processor is configured to read the program in the memory to perform the following process:

reducing a complete binary tree corresponding to a polar codeword into a minimum incomplete binary tree, and determining to-be-processed nodes in the minimum incomplete binary tree, wherein the to-be-processed nodes include at least one type of nodes among Rate0 node, Rate1 node, REP node or SPC node;

interleaving the CRC check bits in the first predetermined number of CRC check bits to positions of last bits in bit sequences of any one of the to-be-processed nodes; wherein the any one of the to-be-processed nodes includes at least one type of nodes among Rate1 node, REP node or SPC node;

according to a position where an interleaved CRC check bit is located, determining a CRC check bit value of the interleaved CRC check bit at the position and filling the value to the position:

wherein the minimum incomplete binary tree means that all leaf nodes of the minimum incomplete binary tree Rate0 node, Rate1 node, REP node or SPC node, and the minimum incomplete binary tree has minimum number of nodes:

for a first layer of the complete binary tree, if both two child nodes of a node are frozen bits then the node is recorded as a Rate0 node; if both two child nodes of a node are information bits, then the node is recorded as a Rate1 node; if a left child node of a node is a frozen bit and a right child node of the node is an information bit, then the node is recorded as an REP node; if a left child node of a node is an information bit and a right child node of the node is a frozen bit, then the node is recorded as a node that is not of the four types;

for a second layer of the complete binary tree, if both two child nodes of a node are Rate0 nodes, then the node is recorded as a Rate0 node; if both two child nodes of a node are Rate1 nodes, then the node is recorded as a Rate1 node; if a left child node of a node is a Rate0 node and a right child node of the node is an REP node, then the node is recorded as an REP node; if a left child node of a node is an REP node and a right child node of a node is a Rate1 node, then the node is recorded as an SPC node; otherwise, a node is recorded as a node that is not of the four types;

for each layer of a third layer to a topmost layer from bottom to top of the complete binary tree, if both two child nodes of a node are Rate0 nodes, then the node is recorded as a Rate0 node; if both two child nodes of a node are Rate1 nodes, then the node is recorded as a Rate1 node; if a left child node of a node is a Rate0 node and a right child node of the node is an REP node, then the node is recorded as an REP node; if a left child node of a node is an SPC node and a right child node of the node is a Rate1 node, then the node is recorded as an SPC node; otherwise, a node is recorded as a node that is not of the four types.

10. The device according to claim 9, wherein an interleaved position L meets the following conditions: $L=2^{N_1}+2^{N_2}+\ldots 2^{N_n}$, wherein $N_1 \ldots N_n$ are arbitrary integers; a value of L is less than or equal to a sum of a length of the to-be-coded sequence and a length of the first predetermined number of CRC check bits;

a first CRC check bit that is filled into a first position in an interleaving manner, is generated by all bits preceding the first position in the to-be-coded sequence;

a second CRC check bit that is filled into an X-th position except for the first position, is generated by all bits which are between a CRC check bit at a (X-1)-th position and the X-th position; the second CRC check bit is generated through a CRC generation matrix: $G_{crc19(D)}=D^{19}+D^{17}+D^{13}+D^{11}+D^9+D^8+D^6+D^5+D^4+D^3+1$; or, the second CRC check bit that is filled into the X-th position except for the first position, is generated by all bits which are between the CRC check bit at the (X-1)-th position and the X-th position as well as a third predetermined number of bits preceding the (X-1)-th position; wherein the third predetermined number is less than or equal to a total number of bits preceding the (X-1)-th position; wherein X is an integer greater than two.

11. The device according to claim 9, wherein the processor is configured to read the program in the memory to perform the following process:

in a first layer of the complete binary tree, if both two child nodes of a first target node are frozen bits, determining the first target node as a Rate0 node; if both two child nodes of the first target node are information bits, determining the first target node as a Rate1 node; if a left child node of the first target node is a frozen bit and a right child node of the first target node is an information bit, determining the first target node as an REP node; if the left child node of the first target node is an information bit and a right child node of the first target node is a frozen bit, determining the first target node as a node that is not of the four types;

in a second layer of the complete binary tree, if both two child nodes of a second target node are Rate0 nodes, determining the second target node as a Rate0 node; if both two child nodes of the second target node are Rate1 nodes, determining the second target node as a Rate1 node; if a left child node of the second target node is a Rate0 node and a right child node of the second target node is an REP node, determining the second target node as an REP node; if the left child node of the second target node is an REP node and the right child node of the first target node is a Rate1 node, determining the second target node as an SPC node; otherwise, determining the second target node as a node that is not of the four types;

for each layer of a third layer to a topmost layer of the complete binary tree from bottom to top, if both two child nodes of a third target node are Rate0 nodes, determining the third target node as a Rate0 node; if both two child nodes of the third target node are Rate1 nodes, determining the third target node as a Rate1 node; if a left child node of the third target node is a Rate0 node and a right child node of the third target node is an REP node, determining the third target node as an REP node; if the left child node of the third target node is an SPC node and the right child node of the third target node is a Rate1 node, determining the third target node as an SPC node; otherwise, determining the third target node as a node that is not of the four types.

12. The device according to claim 11, wherein the transceiver is further configured to transmit information of the interleaved position to the receiving end; or, the processor is further configured to read the program in the memory to perform the following process: pre-agreeing with the receiving end the information of the interleaved position.

13. A polar code decoding device for performing the method according to claim 5, comprising: a transceiver, a memory, a processor and a computer program stored on the memory and executable on the processor;

wherein the transceiver is configured to receive a coded sequence transmitted by a transmitting end;

the processor is configured to read the program in the memory to perform the following process:

obtaining information of an interleaved position of a CRC check bit in the coded sequence; and decoding a coded sequence according to the information of the interleaved position;

wherein the transmitting end fills a first predetermined number of CRC check bits of CRC check bits into the interleaved positions in the to-be-coded sequence in an interleaving manner in a way including:

reducing a complete binary tree corresponding to apolar codeword into a minimum incomplete binary tree, and determining to-be-processed nodes in the minimum incomplete binary tree, wherein the to-be-processed nodes include at least one type of nodes among Rate0 node, Rate1 node, REP node or SPC node;

interleaving the CRC check bits in the first predetermined number of CRC check bits to positions of last bits in bit sequences of any one of the to-be-processed nodes; wherein the any one of the to-be-processed nodes includes at least one type of nodes among Rate1 node, REP node or SPC node;

according to a position where an interleaved CRC check bit is located, determining a CRC check bit value of the interleaved CRC check bit at the position and filling the value to the position;

wherein the minimum incomplete binary tree means that all leaf nodes of the minimum incomplete binary tree Rate0 node, Rate1 node, REP node or SPC node, and the minimum incomplete binary tree has minimum number of nodes;

for a first layer of the complete binary tree, if both two child nodes of a node are frozen bits, then the node is recorded as a Rate0 node; if both two child nodes of a node are information bits, then the node is recorded as a Rate1 node; if a left child node of a node is a frozen bit and a right child node of the node is an information bit, then the node is recorded as an REP node; if a left child node of a node is an information bit and a right child node of the node is a frozen bit, then the node is recorded as a node that is not of the four types;

for a second layer of the complete binary tree, if both two child nodes of a node are Rate0 nodes, then the node is recorded as a Rate0 node; if both two child nodes of a node are Rate1 nodes, then the node is recorded as a Rate1 node; if a left child node of a node is a Rate0 node and a right child node of the node is an REP node, then the node is recorded as an REP node; if a left child node of a node is an REP node and a right child node of a node is a Rate1 node, then the node is recorded as an SPC node; otherwise, a node is recorded as a node that is not of the four types;

for each layer of a third layer to a topmost layer from bottom to top of the complete binary tree, if both two child nodes of a node are Rate0 nodes, then the node is recorded as a Rate0 node; if both two child nodes of a node are Rate1 nodes, then the node is recorded as a Rate1 node; if a left child node of a node is a Rate0 node and a right child node of the node is an REP node, then the node is recorded as an REP node; if a left child node of a node is an SPC node and a right child node of the node is a Rate1 node, then the node is recorded as an SPC node; otherwise, a node is recorded as a node that is not of the four types.

14. The device according to claim 13, wherein the processor is further configured to read the computer program to perform the following process:

according to the coded sequence, reducing a decoding binary tree corresponding to the coded sequence into a minimum incomplete binary tree, and determining to-be-processed nodes in the minimum incomplete binary tree, wherein the to-be-processed nodes include at least one type of nodes among Rate0 node, Rate1 node, REP node or SPC node; and decoding the to-be-processed nodes according to the information of the interleaved position.

15. The device according to claim 14, wherein the processor is further configured to read the computer program to perform the following process:

performing updating soft bit value calculation and feedback calculation of hard decision result for the to-be-processed node;

when determining that the to-be-processed node is filled with a CRC check bit in interleaving manner according to the information of the interleaved position, performing CRC check on a first bit in the hard decision result of the to-be-processed node;

reserving a decoding path corresponding to the to-be-processed node when the CRC check is successful, and deleting a decoding path corresponding to the to-be-processed node when the CRC check is unsuccessful; and ending decoding when decoding paths of all the to-be-processed nodes are deleted.

16. The device according to claim 13, wherein the transceiver is further configured to receive the information of the interleaved position of the CRC check bit in the coded sequence transmitted by the transmitting end; or, the processor is further configured to read the program in the memory to perform the following process: receiving the information of the interleaved position of the CRC check bit in the coded sequence according to a pre-agreement with the transmitting end.

* * * * *